(12) United States Patent
Abeles

(10) Patent No.: US 6,782,025 B2
(45) Date of Patent: Aug. 24, 2004

(54) HIGH POWER DISTRIBUTED FEEDBACK RIDGE WAVEGUIDE LASER

(75) Inventor: Joseph Hy Abeles, Highland Park, NJ (US)

(73) Assignee: Trumpf Photonics, Inc., Cranbury, NJ (US)

(*) Notice: Subject to any disclaimer, the term of this patent is extended or adjusted under 35 U.S.C. 154(b) by 0 days.

(21) Appl. No.: 10/181,467
(22) PCT Filed: Jan. 22, 2001
(86) PCT No.: PCT/US01/02019
§ 371 (c)(1), (2), (4) Date: Nov. 18, 2002
(87) PCT Pub. No.: WO01/54240
PCT Pub. Date: Jul. 26, 2001

(65) Prior Publication Data
US 2003/0147438 A1 Aug. 7, 2003

Related U.S. Application Data
(60) Provisional application No. 60/176,915, filed on Jan. 20, 2000.

(51) Int. Cl.[7] .................................................. H01S 5/00
(52) U.S. Cl. .............................................. 372/46; 372/45
(58) Field of Search ........................... 372/43, 50, 96, 372/45–46

(56) References Cited

U.S. PATENT DOCUMENTS

| 4,615,032 A | | 9/1986 | Holbrook et al. | |
| 4,622,673 A | | 11/1986 | Tsang | |
| 5,147,825 A | * | 9/1992 | Koch et al. | 438/507 |
| 5,189,679 A | | 2/1993 | Derry et al. | |
| 5,208,827 A | * | 5/1993 | Sagawa et al. | 372/108 |
| 5,818,860 A | * | 10/1998 | Garbuzov et al. | 372/45 |
| 5,901,168 A | * | 5/1999 | Baillargeon et al. | 372/96 |
| 6,078,603 A | * | 6/2000 | Weegels et al. | 372/49 |

FOREIGN PATENT DOCUMENTS

| JP | 09-307184 | 11/1997 |

* cited by examiner

Primary Examiner—Quyen P. Leung
(74) Attorney, Agent, or Firm—Fish & Richardson P.C.

(57) ABSTRACT

A distributed feedback ridge waveguide semiconductor laser diode having a waveguide region with a typical thickness of at least 500 nanometers and an effective refractive index difference between the ridge structure and exposed portions of the waveguide region which surround the ridge structure of less than 0.001. This permits the width of the ridge to be expanded beyond 3.5 microns thus translating directly to higher power outputs at 1.55 $\mu$m wavelengths, where carrier diffusion and carrier heating limit current density injected into the active region.

24 Claims, 2 Drawing Sheets

HIGH POWER DISTRIBUTED FEEDBACK RIDGE WAVEGUIDE LASER

PROVISIONAL APPLICATION

This application claims the benefit of Provisional application 60/176,915 filed Jan. 20, 2000.

FIELD OF THE INVENTION

The present invention relates to a ridge waveguide (RWG) semiconductor laser diode having increased output power, to a distributed feedback (DFB) RWG semiconductor laser diode of this kind which exhibits dynamic single longitudinal mode along with increased output power, and, more particularly, to a high power RWG semiconductor laser diode, such as a DFB RWG semiconductor laser diode, having reduced antiguiding effects within the waveguide which permits a larger single mode guide to be utilized.

BACKGROUND OF THE INVENTION

High efficiency, high power lasers have long been pursued for such applications as optical pumping of solid state and fiber lasers, direct material processing, printing, communications, sensing, etc. For example, U.S. Pat. No. 5,818,860, entitled High Power Semiconductor Laser Diode, assigned to David Sarnoff Research Center, Inc., describes a broadened-waveguide technique for producing high-power DFB lasers.

The broadened waveguide concept described in U.S. Pat. No. 5,818,860 permits low loss and therefore high-power lasing in multimode sources. Other characteristics inherent in this concept are of particular promise for high-power single-spatial-mode and dynamic-single-longitudinal-mode lasing. Results of an initial attempt in which the broadened waveguide was incorporated into a 1.55 $\mu$m single mode DFB RWG diode laser has provided encouragement; as there was attained a 200 mW power output single mode, −165 dBm/Hz RIN from 0 to 2 GHz, and 200 kHz linewidths for 1.5 mm cavity length implementations. Further, FIG. 1 shows the RIN performance achieved and 300 MHz linewidth with a broadened waveguide DFB laser. As shown in FIG. 2, this laser emitted 200 mW cw at 1.55 $\mu$m wavelength.

High-power ridge waveguide (RWG) lasers use a cold-cavity index, i.e., effective index, stepof ~$\Delta$n=0.01, but this value under current injection is diminished by antiguiding. Although antiguiding is quantitatively difficult to estimate accurately and is variable, proprietary experiments and extensive published accounts of conventional RWG laser structures lead one to conclude that latitude in the choice of $\Delta$n is severely compromised by the antiguiding phenomenon. As a result, $\Delta$n must be designed to substantially exceed the maximum anticipated antiguiding diminution. For RWG lasers of the prior art, antiguiding has required $\Delta$n values so great that ridge widths must be limited to ~3.5 $\mu$m or narrower to attain a stable, single waveguide mode. The restriction in ridge width limits the power that can be achieved by the laser for several reasons: Firstly, the maximum current density that can be usefully pumped into a semiconductor active region may be limited by phenomena such as the maximum attainable conduction band offsets or other phenomena which affect the maximum power attainable. For wider ridges, a greater current per unit length can usefully be pumped into the active region, causing higher powers to be emitted. Such effects limit the maximum power emitted by the RWG laser under both cw and pulsed conditions. Secondly, an increased ridge width would provide a greater surface area for heat dissipation. Since laser diode performance is severely restricted as temperature rises, wider ridges would permit greater currents to be pumped into the RWG laser and greater powers to be emitted. Such effects presently limit the maximum power emitted by a RWG laser under cw conditions.

Therefore, a high-power RWG laser having a ridge width greater than ~3.5 $\mu$m is needed to provide further gains in power output from any RWG laser such as a DFB RWG laser.

SUMMARY OF THE INVENTION

A semiconductor laser diode comprises a body of a semiconductor material having a length of at least substantially 3 millimeters; a low-propagation-loss waveguide region formed in the body, having a thickness of at least 500 nanometers; a ridge structure disposed over a side of the waveguide region. For applications requiring dynamic single-longitudinal-mode operation, the diode also includes a distributed feedback structure associated with at least one of the waveguide region and ridge structure. The effective refractive index difference between the ridge structure and exposed portions of the waveguide region which surround the ridge structure is less than 0.003. Accordingly, the width of the ridge can be expanded beyond 3.5 microns.

BRIEF DESCRIPTION OF THE DRAWINGS

The advantages, nature, and various additional features of the invention will appear more fully upon consideration of the illustrative embodiments now to be described in detail in connection with accompanying drawings wherein.

DETAILED DESCRIPTION OF THE INVENTION

The high-power DFB RWG laser of the present invention set forth in greater detail further on employs the broadened-waveguide technology described in U.S. Pat. No. 5,818,860, the entire disclosure of which is incorporated herein by reference, to expand the ridge width of the laser beyond 3.5 $\mu$m. The reduced propagation losses due to reduced modal overlap with doped regions permits the laser to operate with reduced overlap with the quantum wells, as occurs in the broadened-waveguide laser of the '860 patent, and causes the active region to operate with lower gain (and lower carrier concentration) which concomitantly reduces antiguiding. This is because it is the nature of the antiguiding effect that a reduction in index is proportional to the increase in the optical gain per unit length, as compared to the materials surrounding the ridge. This effect permits a smaller effective refractive index or index difference $\Delta$n between the ridge region and the surrounding etched region, in turn permitting wider single mode ridge waveguides. This translates directly to higher power outputs at wavelengths such as 1.55 mm, where carrier diffusion and carrier heating limit current density which can usefully injected into the active region, particularly in InGaAsP laser.

Figure 1:
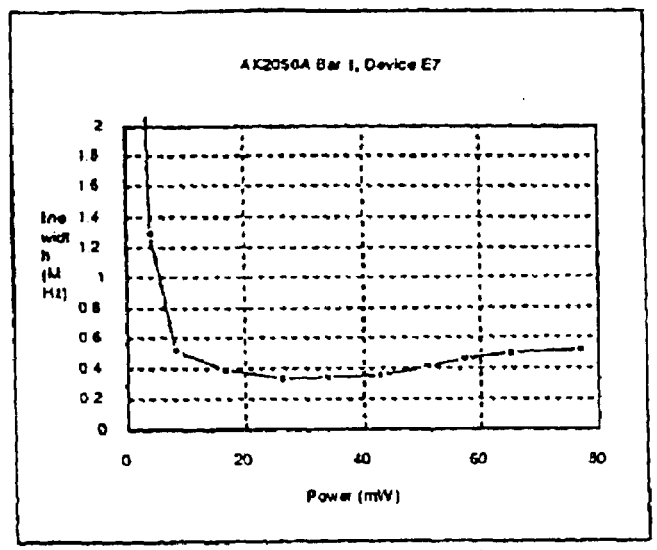
FIG. 1 is a graph plotting linewidth vs. power output of a prior art broadened waveguide DFB laser.
Figure 2:
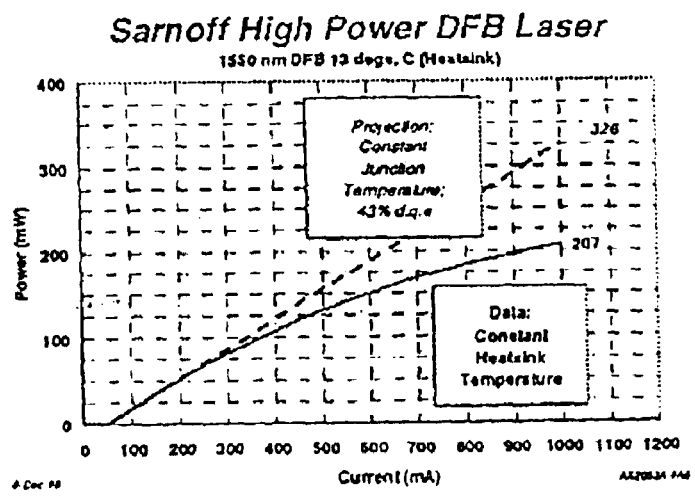
FIG. 2 is a graph plotting power output vs. injection current of a prior art broadened waveguide DFB laser.
Figure 3:
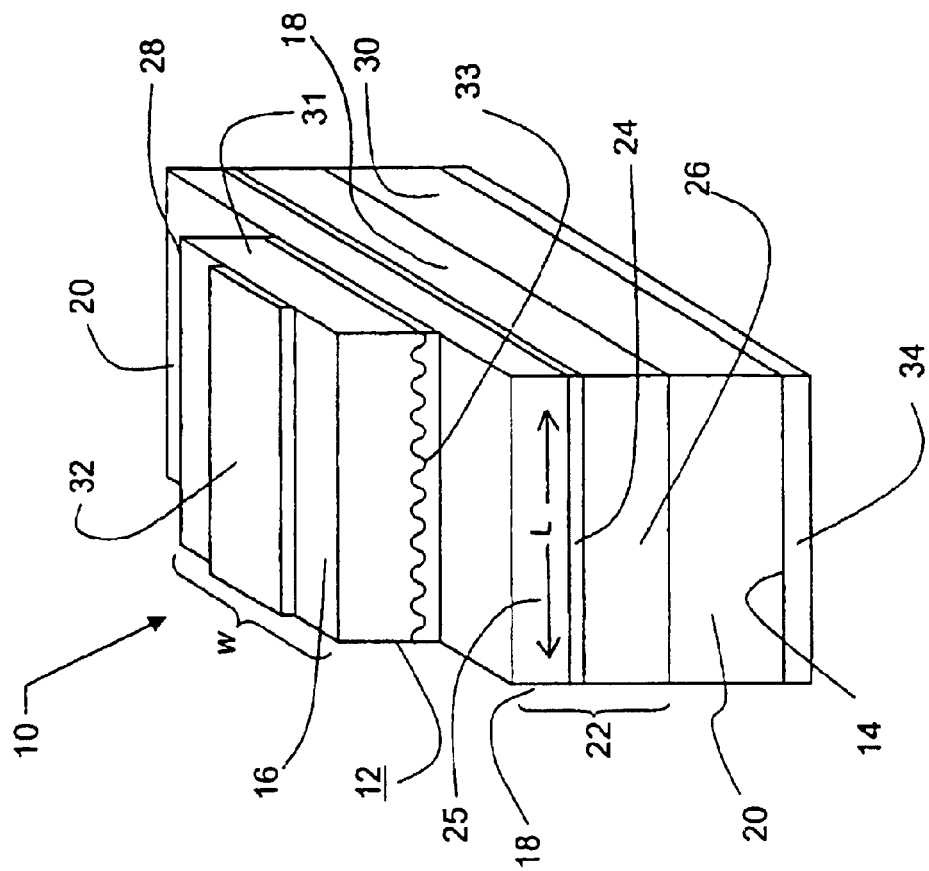
FIG. 3 is a perspective view of a DFB RWG semiconductor laser diode according to an exemplary embodiment of the present invention.

Turning now to FIG. 3, there s shown a DFB RWG semiconductor laser diode 10 according to an exemplary embodiment of the present invention. The laser diode 10 comprises a body 12 of a semiconductor material or materials having a bottom surface 14, top surface 16, end surfaces 18 and side surfaces 20. Laser diode 10 has a length, L, between its end surfaces 18. The body 12 includes a waveguide region 22 extending thereacross. Within the waveguide region 22 is an active region 24 in which photons are generated when an appropriate electrical bias is placed across the diode 10. The active region 24 may be of any structure well known in the laser diode art which is capable of generating photons consistent with the requirement of attaining low optical propagation losses through a broadened waveguide design, or equivalent. Preferably, the active region 24 comprises one or more quantum wells. The waveguide region 22 includes a first layer 25 of "undoped" semiconductor material on a first side of the active region 24 and a second layer 26 of "undoped" semiconductor material on a second side of the active region 24. The first and second layers 25 and 26 of undoped semiconductor material have a doping level of no greater than about $5\times10^{16}$ atoms/cm$^3$.

A first clad region 28 is disposed on the first side of the waveguide region 22. The first clad region 28 may be composed of a semiconductor material of a P-type conductivity. A second clad region 30, which may be formed of a N-type conductivity, is disposed on the second side of the waveguide region. The first clad region 28 is etched so as expose portions of the underlying first layer 25 of undoped semiconductor material. The etched clad region 28 defines a ridge-like structure 31 having a width W. For dynamically single longitudinal mode operation, a distributed feedback structure, formed by corrugations 33, is etched in either the ridge-shape first clad region 28 as shown or in the first layer 25 of undoped semiconductor material.

The composition of the first and second clad regions 28 and 30 of a semiconductor material is of a lower refractive index than the materials of the first and second layers 25 and 26 of the waveguide region 22. The doping level in the first and second clad regions 28 and 30 are typically between about $5\times10^{17}$ atoms/cm$^3$ and $2\times10^{19}$ atoms/cm$^3$.

A contact layer 32 of a conductive material, such as a metal, is on and in ohmic contact with the P-type conductivity ridge-shaped clad region 28. The contact layer 32 is in the form of a strip which extends between the end surfaces 18 of the body 12 and may be narrower than the width of the body 12, i.e., the distance between the side surfaces 20 of the body 12. A contact layer 34 of a conductive material, such as a metal, is on and in ohmic contact with the N-type conductivity clad region 30. The contact layer 34 extends across the entire area of the bottom surface 14 of the body 12.

The thickness of the waveguide region 22 and the composition of the waveguide region 22 and the clad regions 28 and 30 must be such that the optical mode generated by the active region 24 does not overlap from the waveguide region 22 into the more heavily doped clad regions 28 and 30 by more than 5%, and preferably by not more than 2%. However, the amount of overlap of the photons into the clad regions 28 and 30 need not be less than 1%. This means that the amount of the optical mode, which is mainly in the waveguide region 22, that extends into (overlaps) the clad regions 28 and 30 is no greater than about 5% of the total optical mode. To achieve this, the thickness of the waveguide region should be at least 500 nanometers (nm) and the composition of the waveguide region 22 and the clad regions 28 and 30 should be such that the refractive index of the regions provides the confinement of the optical mode in the waveguide region 22 to the extent that the overlap of the optical mode into the clad regions 28 and 30 is not greater than 5%. The various regions of the body 12 may be made of any of the well known semiconductor materials used for making laser diode, such as but not limited to gallium arsenide, aluminum gallium arsenide, indium phosphide, indium gallium arsenide and such quaternary materials as indium, gallium arsenide phosphide. However, the materials used for the various regions must have refractive indices which provide the desired confinement of the optical mode. The clad regions 28 and 30 may be doped uniformly throughout their thickness or may be graded with little or no doping at their junction with the waveguide region 22 and the heaviest doping at the respective surface of the body 12.

The laser diode 10 of the present invention can be made longer than conventional laser diodes, i.e., in lengths of substantially 3 millimeters or longer, because there is lower optical propagation loss in the laser diode of the invention. Moreover, the broadened waveguide region 22, with its reduced antiguiding effects, enables the ridge structure 31 to be etched so that the effective refractive index $\Delta n$, i.e., index difference, between the ridge structure 31 and the exposed portions of the underlying first layer 25 of undoped semiconductor material surrounding the ridge structure 31 is substantially reduced to between about 0.0007 and 0.002. This, in turn, permits width W of the ridge to be increased substantially beyond the 3.5 $\mu$m widths of conventional designs to widths of 5 $\mu$m and greater, therefore translating directly to higher power outputs per unit length at 1.55 $\mu$m wavelengths, where carrier diffusion and carrier heating limit current density injected into the active region, particularly in InGaAsP. That is, power increases due to increased length of the diode as taught in the '860 patent are further extended by 50% to 100% in the structure taught here by increase of the ridge width for an index-guided RWG laser such as a RWG DFB laser diode.

Additionally, the distributed feedback structure produces a coupling constant $\kappa$ which is about 3 times greater than similar structures in conventional laser diodes because of the 3 times greater width of the ridge structure. Consequently, further improvements in thermal dissipation and power density are realized with the laser structure of the present invention.

While the foregoing invention has been described with reference to the above embodiments, various modifications and changes can be made without departing from the spirit of the invention. Accordingly, all such modifications and changes are considered to be within the scope of the appended claims.

What is claimed is:

1. A semiconductor laser diode comprising:

a body of a semiconductor material having a length of at least 2.5 millimeters;

a waveguide region formed in the body;

an active region within the waveguide for generating an optical mode of photons;

a highly doped p-clad layer located on a first side of the waveguide region and formed in the body;

a highly doped n-clad layer located on a second side of the waveguide region and formed in the body; and a ridge structure formed in the body, disposed on a side of the waveguide region, and covering a portion of the waveguide region, while leaving other portions of the waveguide region uncovered, wherein an effective refractive index of the ridge structure and portions of the body covered by the ridge structure differs from an effective refractive index of portions of the body adjacent to the ridge structure and adjacent to the portions of the body covered by the ridge structure by less than 0.002, and wherein the thickness of the waveguide region and the composition of the waveguide and clad regions is such that an overlapping of the optical mode generated in the waveguide region into the clad layers is not greater than about 5%.

2. The semiconductor laser diode of claim 1 wherein a distributed feedback structure is associated with at least one of the waveguide region and the ridge structure.

3. The semiconductor laser diode of claim 1 wherein the waveguide region has a doping level of no greater than $5 \times 10^{16}$ atoms/cm.

4. The semiconductor laser diode of claim 1 wherein the ridge structure is defined by one of two clad regions disposed on opposing sides of the waveguide region, the clad regions being at least partially doped to be of opposite conductivity types.

5. The semiconductor laser diode of claim 3 wherein the materials of the waveguide region and the clad regions have a refractive index which provides confinement of the optical mode to the waveguide region with an overlap of the optical mode into the clad regions of no greater than 5%.

6. The semiconductor laser diode of claim 3 wherein the clad regions are of a semiconductor material having a lower index of refraction than the materials of the portions of the waveguide region adjacent the clad regions.

7. The semiconductor laser diode of claim 3 wherein the ridge structure has a width that is 5 microns or greater.

8. The semiconductor laser diode of claim 2 wherein the distributed feedback structure comprises corrugations.

9. The semiconductor laser diode of claim 2 wherein the distributed feedback structure is formed in the ridge structure.

10. The semiconductor laser diode of claim 2 wherein the distributed feedback structure is formed in the waveguide region.

11. The semiconductor laser diode of claim 1 wherein at least a portion of the body is made from a semiconductor material selected from the group consisting of gallium arsenide, aluminum gallium arsenide, indium phosphide, indium gallium arsenide and indium, gallium arsenide phosphide.

12. The semiconductor laser diode of claim 1 wherein the ridge structure has a P-type conductivity.

13. A semiconductor laser diode comprising:
a body of a semiconductor material having a length of at least 3 millimeters;
a waveguide region formed in the body;
an active region within the waveguide for generating an optical mode of photons;
a highly doped p-clad layer located on a first side of the waveguide region and formed in the body;
a highly doped n-clad layer located on a second side of the waveguide region and formed in the body: and
a ridge structure formed in the body and disposed over a side of the waveguide region, wherein the ridge structure has a width that is greater than 3.5 microns, and wherein the thickness of the waveguide region and the composition of the waveguide and clad regions is such that an overlapping of the optical mode generated in the waveguide region into the clad layers is not greater than about 5%.

14. The semiconductor laser of claim 13 wherein a distributed feedback structure is associated with at least one of the waveguide region and the ridge structure.

15. The semiconductor laser of claim 13 wherein an effective refractive index difference between the ridge structure and exposed portions of the waveguide region which surround the ridge is less than about 0.002.

16. The semiconductor laser diode of claim 13 wherein the waveguide region has a doping level of no greater than $5 \times 10^{16}$ atoms/cm.

17. The semiconductor laser diode of claim 13 wherein the ridge structure is defined by one of two clad regions disposed on opposing sides of the waveguide region, the clad regions being at least partially doped to be of opposite conductivity types.

18. The semiconductor laser diode of claim 17 wherein the materials of the waveguide region and the clad regions have a refractive index which provides confinement of the optical mode to the waveguide region with an overlap of the optical mode into the clad regions of no greater than 5%.

19. The semiconductor laser diode of claim 17 wherein the clad regions are of a semiconductor material having a lower index of refraction than the materials of the portions of the waveguide region adjacent the clad regions.

20. The semiconductor laser diode of claim 14 wherein the distributed feedback structure comprise corrugations.

21. The semiconductor laser diode of claim 14 wherein the distributed feedback structure is formed in the ridge structure.

22. The semiconductor laser diode of claim 14 wherein the distributed feedback structure is formed in the waveguide region.

23. The semiconductor laser diode of claim 13 wherein at least a portion of the body is made from a semiconductor material selected from the group consisting of gallium arsenide, aluminum gallium arsenide, indium phosphide, indium gallium arsenide and indium, gallium arsenide phosphide.

24. The semiconductor laser diode of claim 13 wherein the ridge structure has a P-type conductivity.

\* \* \* \* \*